(12) United States Patent
Wang et al.

(10) Patent No.: US 8,809,099 B2
(45) Date of Patent: Aug. 19, 2014

(54) LIGHT SENSOR HAVING IR CUT INTERFERENCE FILTER WITH COLOR FILTER INTEGRATED ON-CHIP

(71) Applicant: Maxim Integrated Products, Inc., San Jose, CA (US)

(72) Inventors: Zhihai Wang, Sunnyvale, CA (US); Nicole D. Kerness, Menlo Park, CA (US); Stanley Barnett, San Francisco, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/044,284

(22) Filed: Oct. 2, 2013

(65) Prior Publication Data

US 2014/0035012 A1 Feb. 6, 2014

Related U.S. Application Data

(63) Continuation of application No. 13/014,549, filed on Jan. 26, 2011, now Pat. No. 8,598,672.

(51) Int. Cl.
*H01L 21/00* (2006.01)

(52) U.S. Cl.
USPC .......................................................... 438/64

(58) Field of Classification Search
USPC .............................. 257/432, 433, 434; 438/64
See application file for complete search history.

(56) References Cited

U.S. PATENT DOCUMENTS

| | | | |
|---|---|---|---|
| 7,229,671 B2 * | 6/2007 | Keh et al. ...................... | 427/386 |
| 8,274,051 B1 | 9/2012 | Aswell | |
| 8,395,686 B2 | 3/2013 | Tatani et al. | |
| 2006/0024505 A1 | 2/2006 | Keh et al. | |
| 2006/0049412 A1 | 3/2006 | Cho | |
| 2008/0105939 A1 | 5/2008 | Keh et al. | |
| 2009/0147101 A1 * | 6/2009 | Tatani et al. ................ | 348/224.1 |
| 2010/0187557 A1 | 7/2010 | Samoilov | |
| 2011/0024858 A1 | 2/2011 | Yoshihara | |
| 2011/0032398 A1 | 2/2011 | Lenchenkov | |
| 2011/0122303 A1 | 5/2011 | Bonkohara | |
| 2012/0170284 A1 | 7/2012 | Shedletsky | |
| 2012/0187280 A1 | 7/2012 | Kerness et al. | |
| 2012/0187281 A1 | 7/2012 | Kerness et al. | |
| 2012/0187513 A1 | 7/2012 | Holenarsipur et al. | |
| 2012/0187515 A1 | 7/2012 | Kerness et al. | |
| 2012/0312990 A1 | 12/2012 | Aswell | |

FOREIGN PATENT DOCUMENTS

| | | |
|---|---|---|
| JP | 200860320 | 3/2008 |
| WO | 2008081950 | 10/2008 |

OTHER PUBLICATIONS

Pending U.S. Appl. No. 13/337,871, filed Dec. 27, 2011 entitled "Light Sensor Having Transparent Substrate and Diffuser Formed Therein".

* cited by examiner

*Primary Examiner* — Bradley K Smith
(74) *Attorney, Agent, or Firm* — Advent, LLP

(57) ABSTRACT

Techniques are described to furnish a light sensor that includes a patterned IR interference filter integrated with a patterned color pass filter. In one or more implementations, the light sensor includes a substrate having a surface. An IR interference filter configured to block infrared light is disposed over the surface of the substrate. The light sensor also includes one or more color pass filters placed above or below the IR interference filter. The color pass filters are configured to filter visible light to pass light in a limited spectrum of wavelengths to the one or more photodetectors.

15 Claims, 6 Drawing Sheets

LIGHT SENSOR HAVING IR CUT INTERFERENCE FILTER WITH COLOR FILTER INTEGRATED ON-CHIP

CROSS-REFERENCE TO RELATED APPLICATIONS

The present application is a continuation under 35 U.S.C.§120 of U.S. patent application Ser. No. 13/014,549, filed Jan. 26, 2011, entitled "LIGHT SENSOR HAVING IR CUT INTERFERENCE FILTER WITH COLOR FILTER INTEGRATED ON-CHIP," which is hereby incorporated by reference in its entirety.

BACKGROUND

Electronic devices, such as smart phones, tablet computers, digital media players, and so forth, increasingly employ light sensors to control the manipulation of a variety of functions provided by the device. For example, light sensors may be used by an electronic device to detect ambient lighting conditions in order to control the brightness of the device's display screen. Typical light sensors employ photodetectors such as photodiodes, phototransistors, or the like, which convert received light into an electrical signal (e.g., a current or voltage). However, the response of such photodetectors can be influenced by the presence of infrared (IR) light (e.g., electromagnetic radiation having a wavelength greater than approximately 700 nanometers (nm) that can be detected by the photodetector). For example, a light sensor of an electronic device may indicate that the surrounding ambient environment is "brighter" than it really is because the surrounding lighted environment contains a larger proportion of infrared light than normal (e.g., where the surrounding lighted environment is furnished by artificial lighting, and so forth).

SUMMARY

A light sensor is described that includes an IR interference filter and at least one color pass filter integrated on-chip (e.g., integrated on the die of the light sensor). In one or more implementations, the light sensor comprises a semiconductor device (e.g., a die) that includes a substrate. Photodetectors (e.g., photodiodes, phototransistors, etc.) are disposed proximate to the surface of the substrate. An IR interference filter is disposed over the photodetectors. The IR interference filter is configured to filter infrared light from light received by the light sensor to at least substantially block infrared light from reaching the photodetectors. At least one color pass filter, such as an absorption filter that typically passes infrared light as well as a band of visible light, is disposed above or below the IR interference filter. The color pass filter is configured to filter visible light received by the light sensor to pass light in a limited spectrum of wavelengths (e.g., light having wavelengths between a first wavelength and a second wavelength) to at least one of the photodetectors.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1A is a diagrammatic partial cross-sectional side view illustrating a light sensor having an IR cut interference filter, a plurality of color pass filters, and a buffer layer in accordance with an example implementation of the present disclosure.

FIG. 1B is a diagrammatic partial cross-sectional side view illustrating a light sensor having an IR cut interference filter, a plurality of color pass filters, and a buffer layer in accordance with an example implementation of the present disclosure, wherein the light sensor further includes a dark mirror edge formed about the periphery of the IR cut interference filter and buffer layer to block infrared and visible light from entering.

FIG. 2A is a diagrammatic partial cross-sectional side view illustrating a light sensor having an IR cut interference filter, a plurality of color pass filters, and a buffer layer in accordance with an example implementation of the present disclosure, wherein a portion of the buffer layer is removed and the plurality of color pass filters are formed in the area where the buffer layer was removed.

FIG. 2B is a diagrammatic partial cross-sectional side view illustrating a light sensor having an IR cut interference filter, a plurality of color pass filters, and a buffer layer in accordance with an example implementation of the present disclosure, wherein a portion of the buffer layer is removed and the plurality of color pass filters are formed in the area where the buffer layer was removed, and wherein the light sensor further includes a dark mirror edge formed about the periphery of the IR cut interference filter to block infrared and visible light from entering.

DETAILED DESCRIPTION

Overview

Figure 1A:
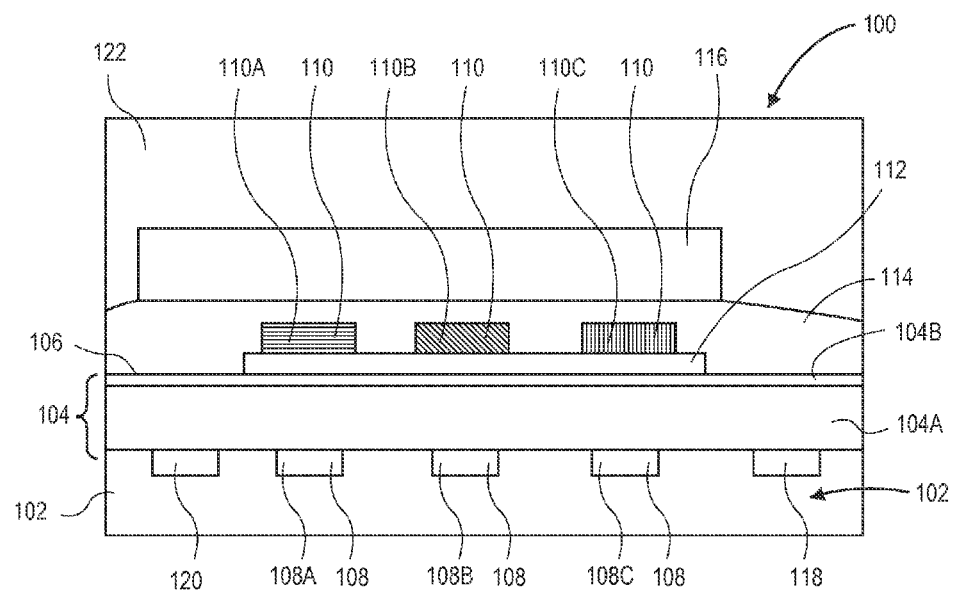

To filter infrared light, light sensors may employ infrared blocking filters to reduce the transmission of infrared light, while passing visible light to the photodetector array of the light sensor. Such IR blocking filters are comprised of IR cut material applied externally to the light sensor package following fabrication of the package. This configuration effectively blocks infrared light from reaching the photodiodes, but also substantially reduces the amount of infrared light that reaches the infrared photodetectors of the light sensor. Consequently, the sensitivity of the resulting light sensor to infrared light is reduced. Additionally, visible light sensors may employ subtraction techniques (e.g., subtraction circuits) to remove infrared light at the wafer level. However, spacing constraints restrict die area available for color pass filters, photodetectors, and subtraction circuits to continue to be utilized on the same chip as more photo detectors are required to detect light in a limited spectrum of wavelengths (e.g., "blue" light, "green" light, "red" light, etc.).

Accordingly, a light sensor is described that includes an IR cut interference filter and at least one color pass filter integrated on-chip (e.g., integrated on the die of the light sensor). In this manner, the IR cut interference filter may be patterned so that it does not block infrared light to infrared photodetectors of the light sensor. In one or more implementations, the light sensor is fabricated as a semiconductor device that comprises a die having a substrate. Photodetectors such as photodiodes, phototransistors, or the like, are formed in the substrate proximate to the surface of the substrate. The IR cut interference filter is disposed proximate to the surface of the substrate over the photodetectors. The IR cut interference filter is configured to filter infrared light from light received by the light sensor to at least substantially block infrared light from reaching the photodetectors. However, by forming the IR cut interference filter on the substrate, the IR cut interference filter may be patterned so that it does not block infrared light to infrared photodetectors of the light sensor. One or more color pass filters are placed above or below the IR cut interference filter. For example, color pass filters (e.g., red, green, blue filters) may be formed on the IR cut interference filter or on the surface of the substrate under the IR cut interference filter. The color pass filters are configured to filter visible light received by the light sensor to pass light in a limited spectrum of wavelengths (e.g., light having wavelengths between a first wavelength and a second wavelength) to at least one of the photodetectors. The photodetectors may also comprise one or more clear photodetectors configured to receive light that is not filtered by a color pass filter, thereby allowing the clear photodetector to detect the ambient light environment.

A buffer layer is formed over the surface of the substrate at wafer level to facilitate formation of the IR cut interference filter and the color pass filters during fabrication of the light sensor. In one implementation, the color pass filters are formed on the surface of the substrate. The buffer layer is then applied to the surface of the substrate over the color pass filters. The buffer layer substantially encloses the color pass filters to protect the filters during further processing steps and to planarize the wafer. The IR cut interference filter is formed and patterned over the buffer layer. In another implementation, the IR cut interference filter is first formed on the surface of the substrate. The buffer layer is then applied to the surface of the substrate over the IR cut interference filter, and the color pass filters are formed over the buffer layer. At least part of the buffer layer may be removed following formation of the color pass filters. The buffer layer thus functions as a sacrificial layer that planarizes the wafer for formation of the color pass filters.

A dark mirror edge may also be formed about the periphery of the IR cut interference filter. The dark mirror edge is configured to at least substantially eliminate impingement of light onto the photodetectors that does not pass through the IR cut interference filter.

In the following discussion, example implementations of light sensors that include an IR cut interference filter and at least one color pass filter integrated on-chip are first described. Example procedures are then discussed that may be employed to fabricate the example light sensor.

Example Implementations

FIGS. 1A through 3B illustrate light sensors 100 in accordance with example implementations of the present disclosure. As shown, the light sensors 100 comprise semiconductor devices that include a die having a substrate 102. The substrate 102 furnishes a base material utilized to form one or more electronic devices through various fabrication techniques such as photolithography, ion implantation, deposition, etching, and so forth. The substrate 102 may comprise n-type silicon (e.g., silicon doped with a group V element (e.g., phosphorus, arsenic, antimony, etc.) to furnish n-type charge carrier elements to the silicon) or p-type silicon (e.g., silicon doped with a group IIIA element (e.g., boron, etc.) to furnish p-type charge carrier elements to the silicon). The substrate 102 may further be comprised of one or more insulating layers 104 and may include a silicon dioxide layer 104A and a silicon nitride layer 104B.

The substrate 102 is illustrated as having a surface 106. An array of photodetectors (photodetectors 108, 118, 120 are shown) is formed in the substrate 102 proximate to the surface 106. The photodetectors 108, 118, 120 within the array may be configured in a variety of ways. For example, the photodetectors 108, 118, 120 may be comprised of a photo sensor diode, a phototransistor, or the like. In an implementation, the photodetectors 108, 118, 120 are capable of detecting light and providing a signal in response thereto. The photodetectors 108, 118, 120 may provide a signal by converting light into current or voltage based upon the intensity of the detected light. Thus, once a photodetector 108, 118, 120 is exposed to light, multiple free electrons may be generated to create a current. The photodetectors 108, 118, 120 are configured to detect light in both the visible light spectrum and the infrared light spectrum. As used herein, the term light is contemplated to encompass electromagnetic radiation occurring in the visible light spectrum and the infrared light spectrum. The visible light spectrum (visible light) includes electromagnetic radiation occurring in the range of wavelengths from approximately three hundred and ninety (390) nanometers to approximately seven hundred and fifty (750) nanometers. Similarly, the infrared light spectrum (infrared light) includes electromagnetic radiation that ranges in wavelength from approximately seven hundred (700) nanometers to approximately three hundred thousand (300,000) nanometers. In implementations, complimentary metal-oxide-semiconductor (CMOS) fabrication techniques may be utilized to form the photodetectors 108, 118, 120.

Color pass filters 110 are illustrated proximate to the surface 106. The color pass filters 110 are configured to filter visible light received by the light sensor 100 to pass light in a limited spectrum of wavelengths (e.g., light having wavelengths between a first wavelength and a second wavelength) to at least one of the photodetectors 108. In an implementation, the color pass filters 110 may comprise absorption filters that allow visible light in a limited spectrum of wavelengths to pass through the filter, while blocking (e.g., absorbing or reflecting) visible light within a second spectrum of wavelengths. Thus, the color pass filter 110 may be substantially transparent for visible light within a first spectrum of wavelengths, and substantially opaque within a second spectrum of wavelengths.

A plurality of patterned color pass filters 110 may be provided. For example, the light sensor 100 may comprise a first color pass filter 110A configured to filter visible light and to pass light having a first limited spectrum of wavelengths (e.g., wavelengths between a first wavelength and a second wavelength), a second color pass filter 110B configured to filter visible light and pass light having a second limited spectrum of wavelengths (e.g., wavelengths between a third wavelength and a fourth wavelength), and a third color pass filter 110C configured to filter visible light and pass light having a third spectrum of wavelengths (e.g., wavelengths between a fifth wavelength and a sixth wavelength), and so forth. In the example illustrated, the light sensor 100 is comprised of an array of three different color pass filters 110: a first (blue) color pass filter 110A configured to transmit a "blue" visible light (e.g., visible light with a wavelength between approximately four hundred fifty (450) nanometers and approximately four hundred seventy-five (475) nanometers); a second (green) color pass filter 110B configured to transmit a "green" visible light (e.g., visible light with a wavelength between approximately four hundred ninety-five (495) nanometers and approximately five hundred and seventy (570) nanometers); and a third (red) color pass filter 110C configured to transmit a "red" visible light (e.g., visible light with a wavelength between approximately six hundred and twenty (620) nanometers and approximately seven hundred and fifty (750) nanometers). It is contemplated that other visible light color pass filters 110 may be employed. The color pass filters 110 may pass infrared light as well. For instance, color pass filters 110 configured to transmit visible light having limited spectrums of wavelengths typically associated with the colors of cyan, magenta, yellow, and so forth may provided. The color pass filters 110 are selectively arrayed over the photodetectors 108 to allow visible light in a desired limited spectrum of wavelengths to pass through the color pass filter 110 to the photodetector 108. For example, as shown in FIGS. 1A through 2B, the first color pass filter 110A is positioned over a first photodetector 108A, the second color pass filter 110B is positioned over a second photodetector 108B, and the third filter 112C is positioned over a third photodetector 108C.

In the implementations illustrated in FIGS. 1A through 2B, the color pass filters 110 are formed over the surface 106 using suitable deposition techniques, such as spin coating and photo patterning. In an example implementation, the color pass filters 110 have a thickness of approximately one (1) micron. However, it is contemplated that color pass filters 110 having lesser or greater thicknesses are possible. The color pass filters 110 may be formed on an adhesion layer 112 to hold the color pass filters 110 in position upon completion of the deposition techniques.

Figure 2A:
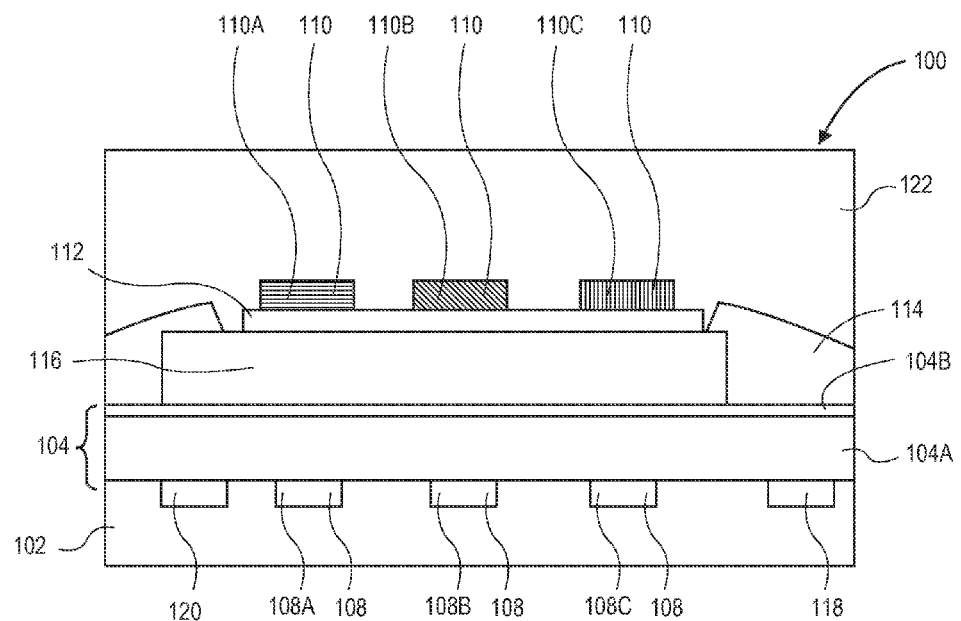
Figure 2B:
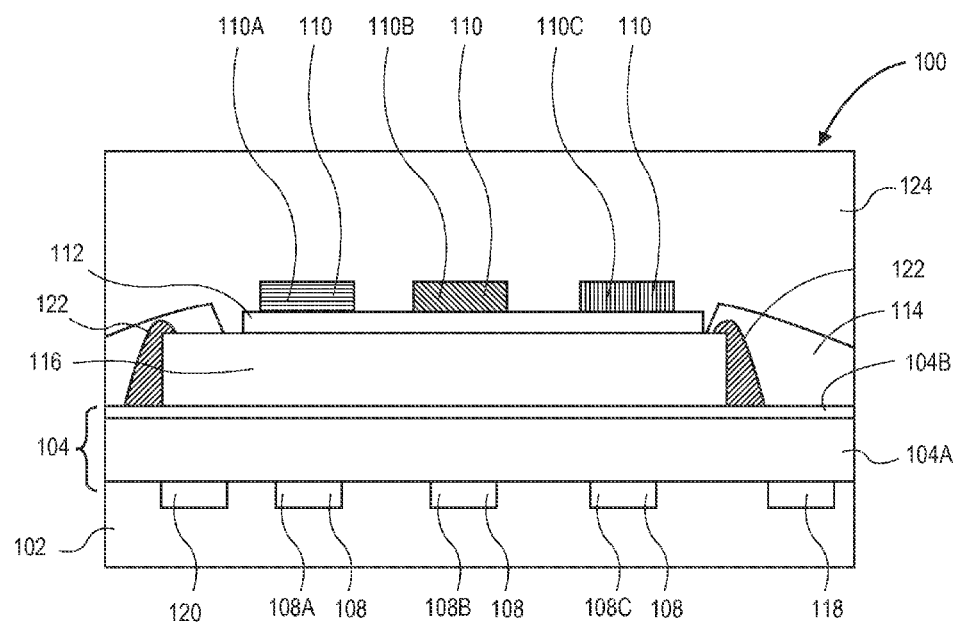

The color pass filters 110 are combined with an IR cut interference filter 116 since the color pass filters 110 may also pass infrared light. In FIGS. 2A and 2B, the IR cut interference filter 116 is illustrated as formed over the photodetectors 108 on the surface 106 of the substrate 102. The IR cut interference filter 116 is configured to filter infrared light from light received by the light sensor to at least substantially block infrared light from reaching the photodetectors. For instance, in an example implementation, an IR cut interference filter 116 may be provided that is capable of blocking approximately fifty (50) to one hundred (100) percent of infrared light (e.g., light in the infrared spectrum) incident on the photodetectors 108 while at least substantially passing (e.g., passing greater than approximately fifty (50) percent) visible light (e.g., light in the visible spectrum) to the photodetectors 108. However, the aforementioned values (e.g., percentage values representing the proportion of infrared light blocked and/or passed by the IR cut interference filter 116) may depend on particular application requirements of the light sensor 100. Thus, IR cut interference filters 116 that are capable of blocking a higher or lower proportion of infrared light and/or of transmitting a higher or lower proportion of visible light are contemplated.

The IR cut interference filter 116 may be configured in a variety of ways. In an implementation, the IR cut interference filter 116 may comprise a multi-layer structure that includes at least two different materials of different refractive indices. The IR cut interference filter 116 may be approximately five (5) to fifteen (15) microns thick and/or approximately seventy (70) to one hundred twenty (120) layers thick. In a specific implementation, the IR cut interference filter 116 may be approximately ten (10) microns thick and/or approximately ninety (90) to one hundred (100) layers thick. However, it is contemplated that the IR cut interference filter 116 may have other constructions (e.g., number of layers) and/or thicknesses.

In one or more implementations, the light sensor 100 may be configured to include one or more infrared photodetectors 118 (e.g., photodetectors 108 that are configured to detect light in the infrared spectrum formed in the substrate 102 of the light sensor 100 die). These photodetectors 118 detect infrared light (e.g., light in the infrared spectrum) that may, for example, be transmitted by an infrared transmitter (e.g., an infrared light emitting diode (LED)) as part of a proximity sensor implemented in the electronic device. Accordingly, the IR cut interference filter 116 may be patterned so that it does not block the reception of infrared light (e.g., light in the infrared spectrum) on the infrared photodetectors 118, thereby increasing the sensitivity of the light sensor to infrared light and improving the performance of devices that employ the light sensor 100 (e.g., the proximity sensor in an electronic device).

A buffer layer 114 is formed over the surface 106 of the substrate 102 to facilitate integration of the IR cut interference filter 116 and/or the color pass filters 110 during fabrication of the light sensor 100. In the implementations shown in FIGS. 1A and 1B, the color pass filters 110 are formed on the surface 106 of the substrate 102. For instance, the color pass filters 110 are formed on the adhesion layer 112, which is formed on the surface 106. The buffer layer 114 is then applied to the surface 106 of the substrate 102 over the color pass filters 110. In this implementation, the buffer layer 114 substantially encloses the color pass filters 110 to protect the filters during further processing steps and to planarize the wafer for the formation of the IR cut interference filter 116, which is formed and patterned over the buffer layer 114. In the implementations shown in FIGS. 2A and 2B, the IR cut interference filter 116 is first formed on the surface 106 of the substrate 102. The buffer layer 114 is then applied to the surface 106 of the substrate 102 over the IR cut interference filter 116. The buffer layer 114 functions as a quasi-sacrificial layer that planarizes the wafer for formation of the color pass filters 110, which are formed over the buffer layer 114. In this implementation, the adhesion layer 112 is formed over the IR cut interference filter 116. The color pass filters 110 may then be formed on the adhesion layer 112. At least part of the buffer layer 114 is patterned via photolithographic patterning techniques or etching techniques prior to formation of the color pass filters 110. The remaining portion of the buffer layer 114 may be removed after formation of the color pass filters 110. The buffer layer 114 transmits visible and infrared light. In one or more implementations, the buffer layer 114 may be comprised of a polymer layer, such as a Benzocyclobutene (BCB) polymer. However, it is contemplated that other encapsulating buffer materials may be used.

The array of photodetectors 108 may further include one or more clear photodetectors 120 configured to receive light that is not filtered by a color pass filter 110. As illustrated, the clear photodetectors 120 may be positioned in the substrate 102 so that they are positioned under the IR cut interference filter 110 but are not located below a color pass filter 110. Thus, the clear photodetectors 120 detect light within a spectrum of wavelengths corresponding to several visible colors (e.g., light from the visible spectrum). In this manner, the clear photodetectors 120 may be used to detect visible ambient lighting conditions absent infrared interference.

The clear photodetectors 120 may be configured in a variety of ways. For example, like the other photodetectors 108 within the array, the clear photodetector(s) 120 may comprise a photodiode, a phototransistor, or the like, that is capable of detecting a light by converting light into current or voltage. In an implementation, the signal (e.g., current or voltage) produced by the clear photodetectors 120 is based upon (e.g., proportional to) the detected intensity of visible light received. Thus, the clear photodetectors 120 may be used to detect the intensity of the ambient light level outside of a portable electronic device (not shown) in which the light sensor 100 is integrated. The resulting measure of ambient light intensity may be utilized by various applications running in the portable electronic device. For example, an application of the portable electronic device may control the brightness of a display screen based upon the ambient light intensity.

Figure 1B:
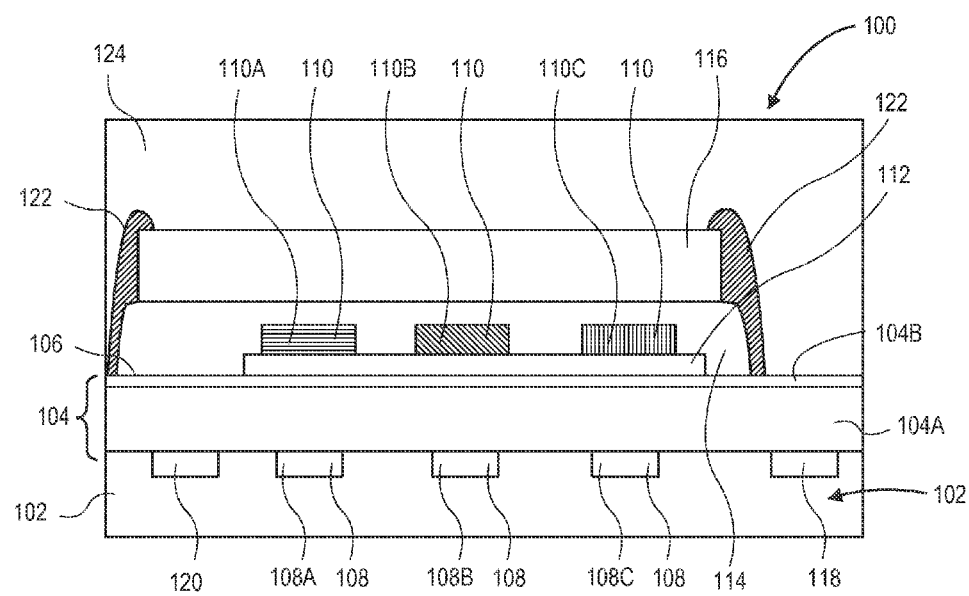
Figure 3A:
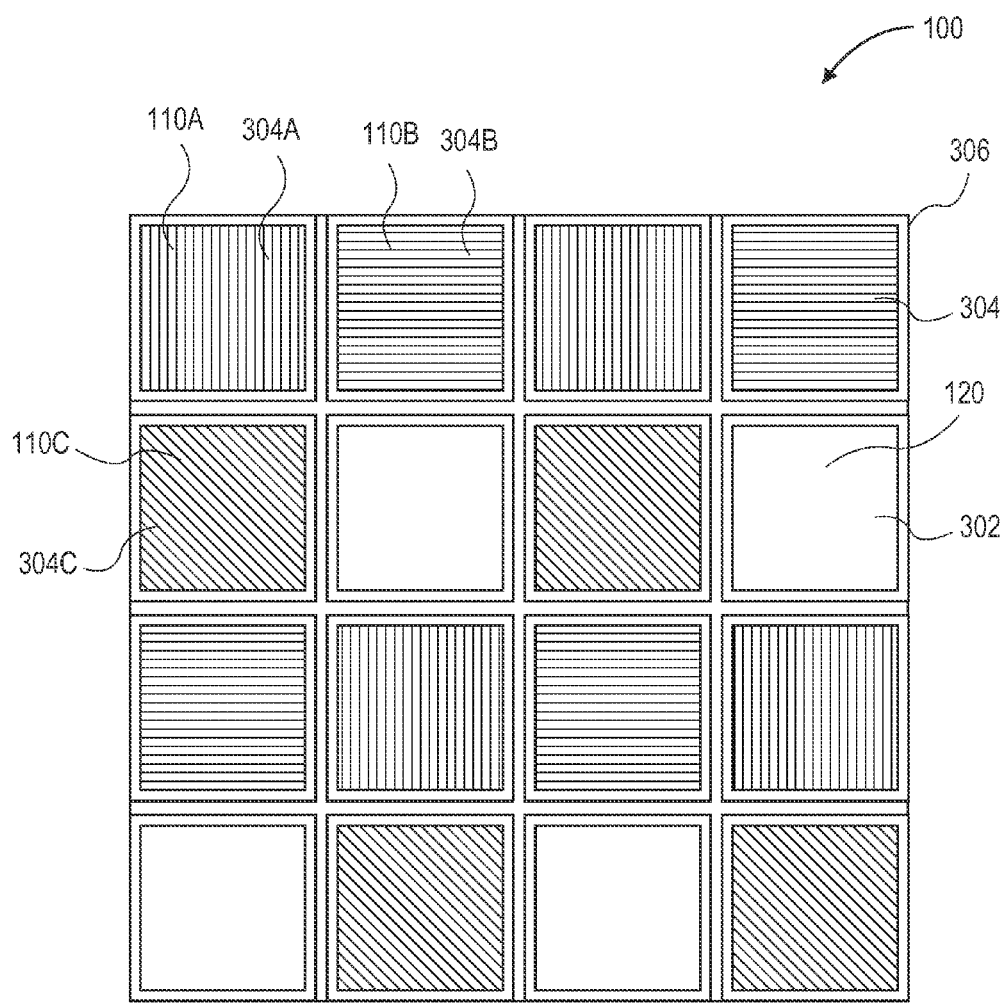
FIG. 3A is a diagrammatic top plan view illustrating the light sensors of FIGS. 1A and 2A.
Figure 3B:
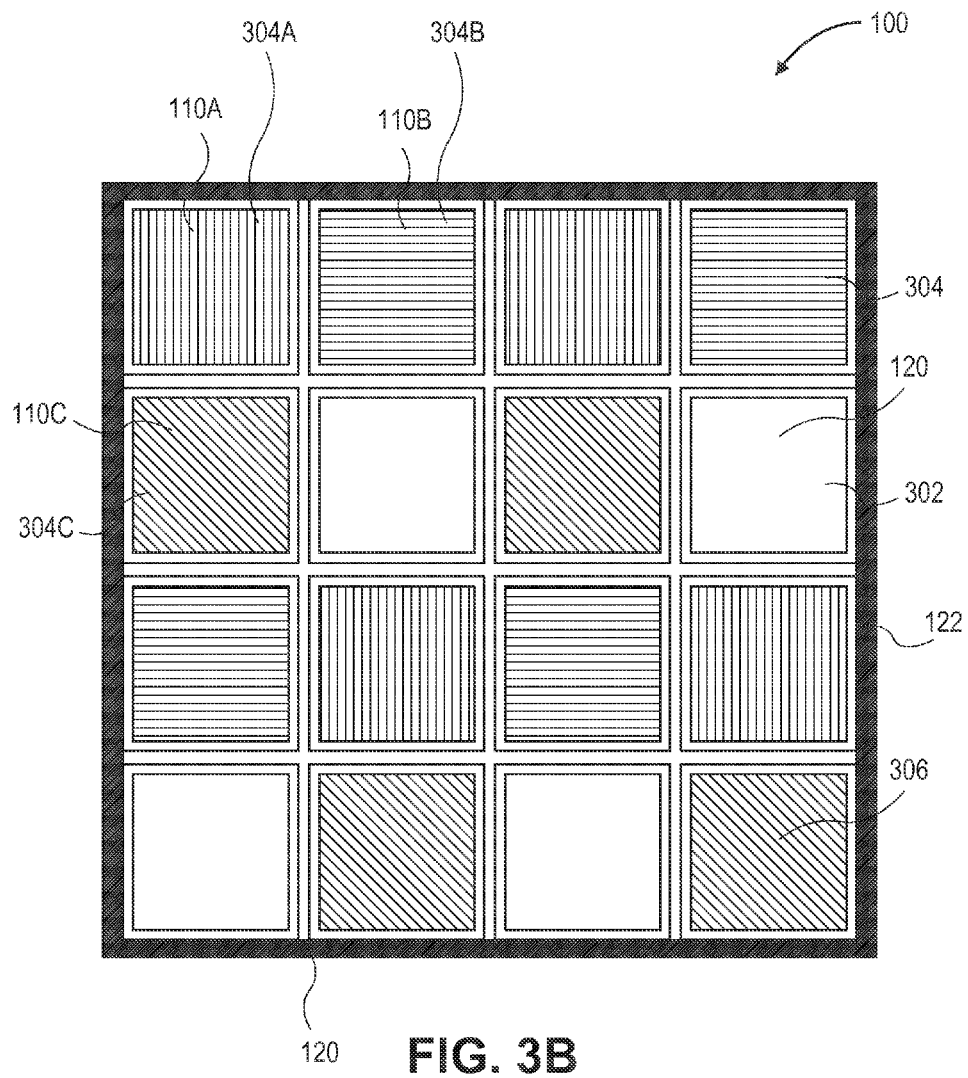
FIG. 3B is a diagrammatic top plan view illustrating the light sensors of FIGS. 1B and 2B.

In FIGS. 1B, 2B, and 3B, the light sensor 100 illustrated further includes a dark mirror edge 122 configured to at least substantially eliminate impingement of light that does not pass through the IR cut interference filter 116 on the photodetectors 108. The dark mirror edge 122 is formed of an opaque material that does not transmit light (visible light and infrared light). In FIG. 1B, the dark mirror edge 122 is shown as being formed over the IR cut interference filter 116 and the buffer layer 114 so that it covers the edges of the IR cut interference filter 116 and the buffer layer 114. In FIG. 2B, the dark mirror edge 122 is shown as being formed over the IR cut interference filter 116 but beneath the buffer layer 114. As shown in FIG. 3B, the dark mirror edge 122 may be positioned about the periphery of the IR cut interference filter 116. The dark mirror edge 122 may also cover the edges of buffer layer 114 to substantially block light from passing through the edges of the buffer layer 114 (see FIG. 1B). However, it is contemplated that the dark mirror edge 122 may have a variety of patterns depending on application requirements.

An insulating material 124 may be applied over the surface 106 of the substrate 102 to provide insulation and protection to the various structures of sensor 100 (e.g., the photodetectors 108, the color pass filters 110, the buffer layer 114, the interference filter 116, and so forth). In one or more implementations, the insulating material 124 is an epoxy material. However, other insulating materials may be used and are contemplated.

As discussed above, the clear photodetectors 120 may be arrayed with the photodetectors 108 that receive light that passes through a color pass filter 110 (e.g., an absorption filter). In the implementation illustrated in FIGS. 3A and 3B, the clear photodetectors 120 are shown positioned in one or more cells (clear sensor cells 302) that are arrayed with cells (color sensor cells 304) containing photodetectors 108 that receive light that passes through a color pass filter 110. Thus, in the implementation illustrated, the light sensor 100 may include an array 306 of cells 302, 304 having one or more clear sensor cells 302 that do not include a color pass filter 110, one or more first color sensor cells 304A that comprise a first color pass filter 110A (e.g., a blue color pass filter), one or more second color sensor cells 304B that comprise a second color pass filter 110B (e.g., a green color pass filter), one or more third cells 304C that comprise a third color pass filter 110C (e.g., a red color pass filter), and so forth. As noted above, it is contemplated that a wide variety of visible light color pass filters 110 may be employed by the light sensor 100. Thus, color sensor cells 304 may comprise color pass filters 110 configured to transmit light having colors of cyan, magenta, yellow, and so forth.

In various implementations, the light sensors 100 described herein may be configured to detect a surrounding light environment and/or to provide infrared light detection (e.g., for use as a proximity sensor). The color pass filters 110 are configured to filter visible light and pass light in a limited spectrum of wavelengths to the respective photodetectors 108. The photodetectors 108 generate a signal (e.g., current value) based upon the intensity of the light. The IR cut interference filter 116 is configured to filter infrared light to substantially block infrared light from reaching the photodetectors 108. The clear photodetector(s) 120 detect ambient lighting conditions absent color filtration and generate a signal (e.g., a current value) based upon the intensity of visible light detected. The signal generated by the photodetectors 108 and the clear photodetector(s) 120 may be utilized by other circuit devices and/or applications to control various aspects of a portable electronic device (e.g., control the brightness of the device's display screen to turn off backlighting to conserve battery life, and so forth). Infrared photodetectors 118 may detect infrared light (e.g., light in the infrared spectrum) and generate a signal (e.g., a current value) based upon the intensity of the infrared light detected. The signal generated by the infrared photodetectors 118 may be utilized by other circuit devices and/or applications to control various aspects of a portable electronic device. For example, infrared light may be transmitted by an infrared transmitter (e.g., an infrared light emitting diode (LED)) and detected by the infrared photodetectors 118 of the light sensor 100 as part of an infrared image sensor or a proximity sensor implemented in an electronic device. The IR cut interference filter 116 may be patterned so that it does not block the reception of infrared light by the infrared photodetectors 118, thereby increasing the sensitivity of the light sensor to infrared light and improving the performance of devices that employ the light sensor 100.

Example Fabrication Process

The following discussion describes example techniques for fabricating a light sensor that includes an IR cut interference filter and at least one color pass filter integrated on-chip (e.g., integrated on the die of the light sensor). In the implementation described below, the light sensor is fabricated utilizing back-end complementary metal-oxide-semiconductor (CMOS) processing techniques. However, it is contemplated that light sensors in accordance with the present disclosure may be fabricated using other semiconductor chip fabrication/packaging technologies, such as wafer-level packaging (WLP), and so on.

Figure 4:
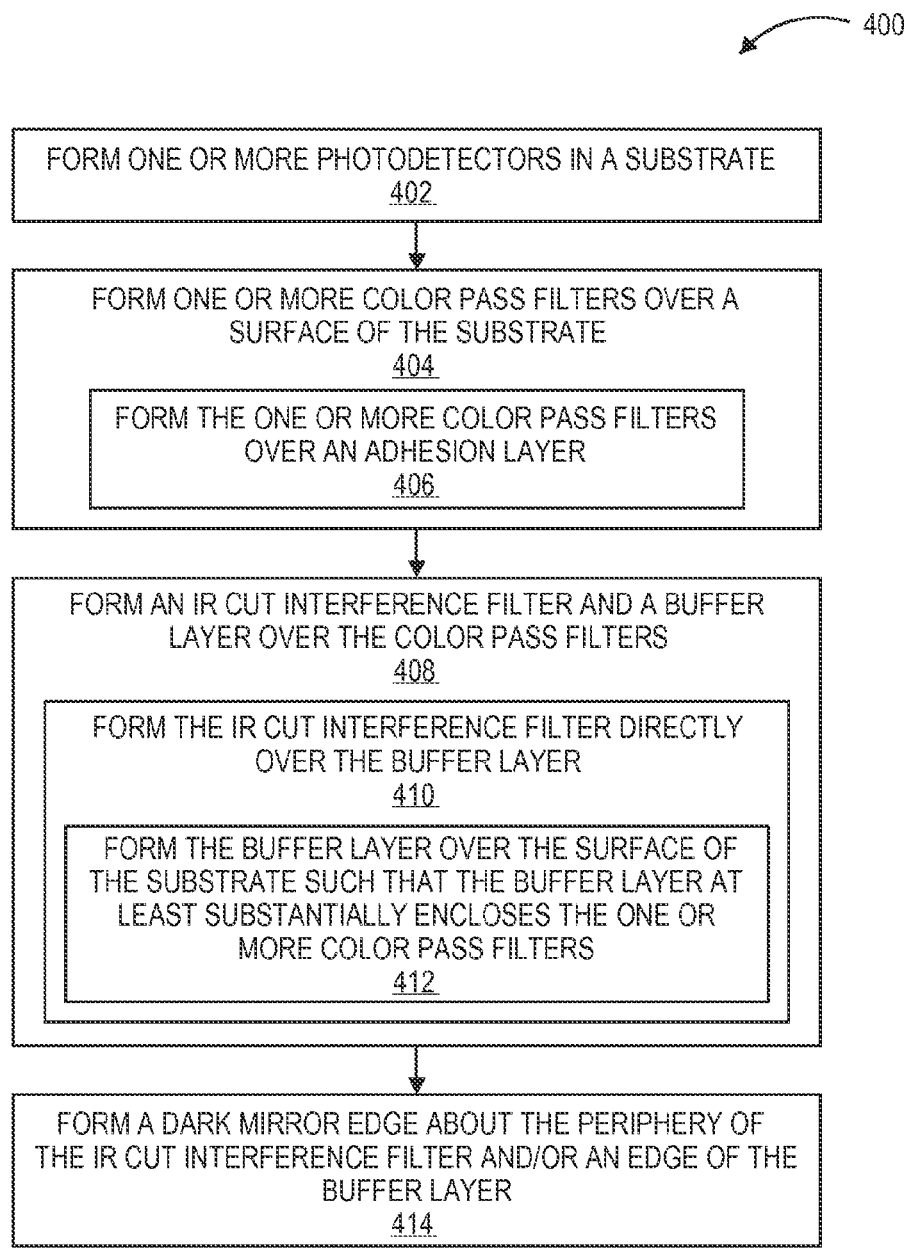
FIG. 4 is a flow diagram illustrating an example process in an example implementation for fabricating light sensors having an IR cut interference filter, a plurality of color pass filters, and a buffer layer in accordance with the present disclosure.

FIG. 4 depicts a process 400, in an example implementation, for fabricating a light sensor, such as the example light sensors 100 illustrated in FIGS. 1A, 1B, 3A, and 3B and described above. In the process 400 illustrated, one or more photodetectors are formed in a substrate of a wafer (Block 402). As noted in the discussion of FIGS. 1A and 1B, the substrate may comprise n-type silicon (e.g., silicon doped with a group V element (e.g., phosphorus, arsenic, antimony, etc.) to furnish n-type charge carrier elements to the silicon) or p-type silicon (e.g., silicon doped with a group IIIA element (e.g., boron, etc.) to furnish p-type charge carrier elements to the silicon). Thus, the substrate furnishes a base material utilized to form the photodetectors as well as other electronic devices of the light sensor. The photodetectors may comprise photodiodes, phototransistors, or the like, formed in the substrate of the wafer using suitable fabrication techniques such as photolithography, ion implantation, deposition, etching, and so forth. In one or more implementations, at least one photodetector of the plurality of photodetectors may comprise an infrared photodetector that is configured to detect an infrared light (light in the infrared spectrum).

One or more color pass filters are formed over a surface of the substrate (Block 404). For example, in various implementations, the color pass filters may be formed over an adhesion layer that is configured to adhere the color pass filters to the surface on which they are formed (Block 406). As shown in FIGS. 1A and 1B, the color pass filters may be aligned with a respective photodetector to filter light received by that photodetector. When formed, the color pass filters may have a thickness of approximately one (1) micron. However, it is contemplated that color pass filters having lesser or greater thicknesses are possible.

In the process 400 illustrated, the buffer layer and an IR cut interference filter are formed over the color pass filters (Block 408). The IR cut interference filter is formed over the buffer layer (Block 410). The buffer layer is then formed over the surface of the substrate such that the buffer layer substantially encloses, or encapsulates, the color pass filters (Block 412). As noted in the discussion of FIGS. 1A and 1B, the buffer layer may be comprised of a polymer, such as a BCB based polymer, and may be formed using a suitable deposition technique.

The IR cut interference filter may further be patterned so that it does not block the reception of infrared light (e.g., light in the infrared spectrum) by infrared photodetectors formed in the substrate, as described in the discussion of Block 402. For instance, in an example implementation, the IR cut interference filter may comprise a multi-layer structure that includes two different materials that each has a different refractive index to create an interference effect to block infrared light. In such implementations, the various layers of the IR cut interference filter may be formed on a wafer using sputtering deposition techniques and patterned using resist lift-off techniques. However, it is contemplated that other techniques may be employed, including, but not limited to: chemical vapor deposition (CVD), electrochemical deposition (ECD), molecular beam epitaxy (MBE), and atomic layer deposition (ALD). When formed, the IR cut interference filter may be approximately five (5) to approximately fifteen (15) microns thick and/or approximately seventy (70) to one hundred and twenty (120) layers thick. However, it is contemplated that the IR cut interference filter may have other constructions and/or thicknesses. The buffer layer is utilized to facilitate formation of the IR cut interference filter and/or the color pass filters.

In one or more implementations, a dark mirror edge may be provided about the periphery of the IR cut interference filter and/or an edge of the buffer layer (Block 414) to substantially eliminate impingement of light on the photodetectors that does not pass through the IR cut interference filter. The dark mirror edge is formed of opaque materials (e.g., metal/oxide multilayer, or the like) that do not transmit light (visible light and infrared light). The dark mirror edge may be formed using a variety of techniques, such as via the deposition/patterning techniques, and so forth. For example, sputtering and photoresist lift-off techniques may be utilized to form the dark mirror edge.

Figure 5:
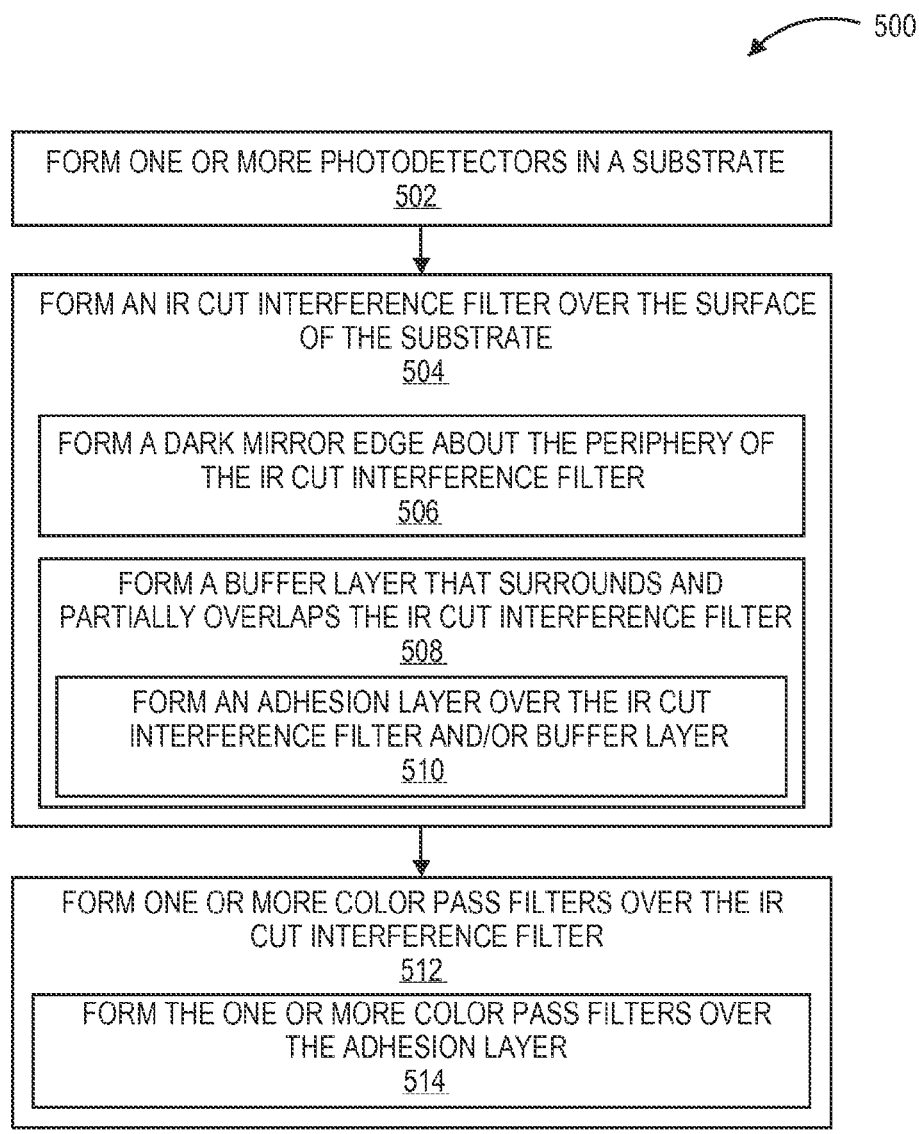
FIG. 5 is a flow diagram illustrating another example process in an example implementation for fabricating light sensors having an IR cut interference filter, a plurality of color pass filters, and a buffer layer in accordance with the present disclosure.

FIG. 5 depicts a process 500, in an example implementation, for fabricating a light sensor, such as the example light sensors 100 illustrated in FIGS. 2A, 2B, 3A, and 3B. In the process 500 illustrated, one or more photodetectors are again formed in a substrate of a wafer (Block 502). As described in the discussion of FIG. 4, the substrate furnishes a base material utilized to form photodetectors as well as other electronic devices of the light sensor.

An IR cut interference filter is formed over the surface of the substrate (Block 504). In the process 500 illustrated, the IR cut interference filter is formed directly on the surface of substrate. In one or more implementations, a dark mirror edge may again be provided about the periphery of the IR cut interference filter (Block 506) to substantially eliminate impingement of light on the photodetectors that does not pass through the IR cut interference filter. A buffer layer is formed that at least partially surrounds and at least partially overlaps the IR cut interference filter (Block 508). As described in the discussion of FIGS. 2A and 2B above, the buffer layer functions as a quasi-sacrificial buffer layer to allow planarization of the IR cut interference filter to facilitate formation of the color pass filters.

An adhesion layer is then formed over the IR cut interference filter and/or the buffer layer (Block 510). One or more color pass filters are then formed over the IR cut interference filter (Block 512). As described in the discussion of Block 404 and Block 406 of FIG. 4, the color pass filters may be aligned with a respective photodetector to filter light received by that photodetector (as shown in FIGS. 2A and 2B). The one or more color pass filters may be formed over the adhesion layer (Block 514), which is configured to adhere the color pass filters to the surface on which the color pass filters are formed.

As noted, the light sensor may be fabricated utilizing back-end complementary metal-oxide-semiconductor (CMOS) processing techniques. Thus, the photodetectors, the color pass filters, the buffer layer, and the IR cut interference filter may be formed at wafer level. The wafer is thereafter diced into one or more dies, and each die packaged individually to form a light sensor. The wafer may also be further processed following formation of the photodetectors, color pass filters, buffer layer, and IR cut interference filter using wafer-level packaging (WLP) techniques and diced to form one or more light sensors.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A light sensor comprising:
   a substrate having a surface;
   one or more photodetectors disposed proximate to the substrate and configured to detect light and to provide a signal in response thereto;
   one or more color pass filters disposed proximate to the surface, the one or more color pass filters configured to filter visible light to pass light in a limited spectrum of wavelengths to the one or more photodetectors;
   an IR cut interference filter disposed over the one or more photodetectors, the IR cut interference filter configured to filter infrared light to at least substantially block infrared light from reaching the one or more photodetectors;
   an insulation layer disposed over the surface such that the insulation layer substantially encloses the one or more color pass filters and the IR cut interference filter.

2. The light sensor as recited in claim 1, further comprising a buffer layer disposed over the surface of the substrate to facilitate formation of at least one of the IR cut interference or the color pass filter.

3. The light sensor as recited in claim 1, wherein at least one of the one or more photodetectors comprises a clear photodetector, the clear photodetector configured to receive light unfiltered by the one or more color pass filters to detect an ambient light environment.

4. The light sensor as recited in claim 1, wherein the IR cut interference filter is a patternable IR cut interference filter.

5. The light sensor as recited in claim 1, further comprising an adhesion layer disposed between the surface and the one or more color pass filters.

6. The light sensor as recited in claim 1, further comprising a dark mirror edge disposed about a periphery of the IR cut interference filter, the dark mirror edge configured to at least substantially eliminate impingement of light that does not pass through the IR cut interference filter.

7. A light sensor comprising:
   a substrate having a surface;
   one or more photodetectors disposed proximate to the substrate, the one or more photodetectors configured to detect light and provide a signal in response thereto;
   an IR interference filter disposed over the surface, the IR interference filter configured to filter infrared light to at least substantially block infrared light from reaching the one or more photodetectors;
   one or more color pass filters disposed proximate to the IR interference filter and configured to filter visible light to pass light in a limited spectrum of wavelengths to the one or more photodetectors; and
   a buffer layer disposed over the surface of the substrate to facilitate formation of at least one of the IR interference or the color pass filter,
   wherein the one or more color pass filters are disposed on the adhesion layer, the buffer layer is formed over the surface such that the buffer layer substantially encloses the one or more color pass filters, and the IR interference filter is formed at least partially over the buffer layer.

8. The light sensor as recited in claim 7, further comprising a dark mirror edge disposed about a periphery of the IR interference filter, the dark mirror edge configured to at least substantially eliminate impingement of light that does not pass through the IR interference filter.

9. The light sensor as recited in claim 7, further comprising an adhesion layer disposed over the surface for holding the one or more color pass filters in position.

10. The light sensor as recited in claim 7, wherein the one or more photodetectors comprises a clear photodetector, the clear photodetector configured to receive light unfiltered by a color pass filter to detect an ambient light environment.

11. The light sensor as recited in claim 7, wherein the one or more photodetectors comprise at least one of photodiodes or phototransistors.

12. A process comprising:
   providing one or more photodetectors in or on a substrate, the one or more photodetectors configured to detect light and to provide a signal in response thereto;
   providing one or more color pass filters over a surface of a substrate, the one or more color pass filters configured to filter visible light to pass light in a limited spectrum of wavelengths to the one or more photodetectors;
   providing an IR cut interference filter over the surface, the IR cut interference filter configured to configured to at least substantially block infrared light from reaching the surfaces; providing a buffer layer proximate to the surface;
   providing an adhesion layer over the surface, the adhesion layer configured to hold the one or more color pass filters in position;
   providing the one or more color pass filters on the adhesion layer;
   providing the IR cut interference filter over the surface of the substrate;
   providing the buffer layer over the IR cut interference filter;
   planarizing at least a portion of the buffer layer;
   providing the adhesion layer on a surface of the IR cut interference filter; and
   providing the one or more color pass filters on the adhesion layer.

13. The process as recited in claim 12, wherein the IR cut interference filter is at least substantially coextensive with the one or more color pass filters.

14. The process as recited in claim 12, further comprising providing a dark mirror edge about the IR cut interference filter and the buffer layer, the dark mirror edge configured to at least substantially eliminate impingement of light that does not pass through the IR cut interference filter onto the one or more photodetectors.

15. The process as recited in claim 12, wherein the buffer layer comprises a Benzocyclobutene (BCB) polymer.

* * * * *